(12) United States Patent
Feng et al.

(10) Patent No.: US 9,324,742 B2
(45) Date of Patent: Apr. 26, 2016

(54) ARRAY SUBSTRATE AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Bin Feng, Beijing (CN); Hongtao Lin, Beijing (CN); Zhangtao Wang, Beijing (CN); Xibin Shao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 162 days.

(21) Appl. No.: 13/975,972

(22) Filed: Aug. 26, 2013

(65) Prior Publication Data

US 2014/0054703 A1 Feb. 27, 2014

(30) Foreign Application Priority Data

Aug. 27, 2012 (CN) .......................... 2012 1 0308758

(51) Int. Cl.
*H01L 27/12* (2006.01)
*G02F 1/1343* (2006.01)

(52) U.S. Cl.
CPC ...... *H01L 27/1288* (2013.01); *G02F 1/134363* (2013.01); *H01L 27/124* (2013.01); *G02F 2001/134318* (2013.01); *G02F 2001/134372* (2013.01)

(58) Field of Classification Search
CPC .............. G02F 1/134363; G02F 2001/134318; G02F 2001/134372; H01L 27/124; H01L 27/1288
USPC ........................................... 257/347; 438/151
See application file for complete search history.

(56) References Cited

U.S. PATENT DOCUMENTS 6,506,617 B1 * 1/2003 Cheng ............................ 438/22
2003/0085406 A1 5/2003 Cheng

FOREIGN PATENT DOCUMENTS

CN 202735644 U 2/2013
TW 522570 B 3/2003

OTHER PUBLICATIONS

Extended European Search Report dated Nov. 13, 2013 Appln. No, 13181560.7—1904.
First Chinese Office Action dated Jun. 4, 2014; Appln. No. 201210308758.2.
Second Chinese Office Action Appln. No. 201210308758.2; Dated Jan. 16, 2015.
Third Chinese Office Action Appln. No. 201210308758.2; Dated Jun. 12, 2015.
Fourth Chinese Office Action dated Nov. 16, 2015; Appln. No. 201210308753.2.

* cited by examiner

*Primary Examiner* — Trung Q Dang
(74) *Attorney, Agent, or Firm* — Ladas & Parry LLP

(57) ABSTRACT

Embodiments of the invention provide an array substrate comprising a plurality of pixel units, each of the pixel units including a first display electrode, a second display electrode and an insulating portion, wherein, the insulating portion comprises a plurality of first via holes; the first display electrode is disposed at a surface of the insulating portion, and the second display electrode is disposed at bottom surfaces of the first via holes. Embodiments of the invention further provide a method for manufacturing the array substrate.

12 Claims, 6 Drawing Sheets

ARRAY SUBSTRATE AND MANUFACTURING METHOD THEREOF

BACKGROUND

Embodiments of the present invention relate to an array substrate and a manufacturing method thereof.

Currently, Thin Film Transistor Liquid Crystal Displays (TFT-LCDs) have a variety of electric field display modes, such as ADS (Advanced Super Dimension Switch), In-Plane Switching (IPS), (Vertical Alignment) VA, etc, and in different display modes, they have different design structures. Thus, they not only differ remarkably in terms of quality of products, but also have a large difference in fabrication process of an array substrate as well.

FIG. 1 shows the structure of an array substrate of an IPS display mode, which comprises a base substrate 11, a pixel electrode 12 and a common electrode 13. Its pixel electrode 12 and common electrode 13 are arranged alternately on the same plane, so as to form electric fields in the directions of arrows in FIG. 1. Based on the structure shown in FIG. 1, a four-patterning process (i.e. 4 masks) is used to fabricate the array substrate of the IPS display mode, specifically, it comprises: patterning of a gate line and a gate electrode, patterning of an active layer, a data line and source and drain electrodes, patterning of a via hole, and patterning of a pixel electrode and a common electrode. That is, in the array substrate of IPS display mode, the pixel electrode and the common electrode are formed in the same patterning process.

FIG. 2 shows the structure of an array substrate of an ADS display mode, which comprises a base substrate 21, a pixel electrode 22 and a common electrode 23, and its pixel electrode 22 and common electrode 23 are arranged in an upper layer and a bottom layer, respectively. As shown in FIG. 2, the pixel electrode 22 is located in the upper layer and composed of a transparent electrode pattern with a slit structure, an insulating layer is provided between the pixel electrode 22 and the common electrode 23, and the common electrode 23 is located in the lower layer and disposed at least in positions corresponding to slits in the pixel electrode 22, so as to form electric fields in the directions of arrows in FIG. 2. Based on the structure shown in FIG. 2, a (1+4)-patterning process (i.e. (1+4) masks) is used to fabricate the array substrate of the ADS display mode, and as compared to the four-patterning process for the array substrate of the IPS display mode, it is necessary for this manufacturing method to form the pixel electrode and the common electrode, respectively. Thus, the (1+4)-patterning process used for the array substrate in the ADS display mode has one more patterning step than the four-patterning process used for the array substrate in the IPS display mode.

As can be seen from FIG. 1 and FIG. 2, when compared with the array substrate of the IPS display mode, the array substrate of the ADS display mode has the following features. The controllable area of an electric field formed by a pixel electrode and a common electrode of the array substrate of the ADS display mode is wider, and thus it is better than that of the IPS display mode in terms of transmittance, luminance, contrast, etc. However, there is a relatively large overlapping zone between the pixel electrode and the common electrode in the array substrate of the ADS display mode, and a larger storage capacitance may be formed, causing Greenish (greenish picture), line image sticking and other disadvantageous quality defect, which will be more and more obvious as the size of a panel becomes larger. Further, the (1+4)-patterning process used for the array substrate in the ADS display mode is more cockamamie than the four-patterning process used for the array substrate in the IPS display mode, and the production cost will be a little higher as well.

In summary, the array substrate of the ADS display mode and the array substrate of the IPS display mode each have their own advantages and disadvantages, and therefore, to produce a new array substrate of an edge-electric-field display mode capable of combining the merits of the two has become an important research subject.

SUMMARY

According to an embodiment of the invention, there is provided an array substrate that comprises a plurality of pixel units, the pixel unit including a first display electrode, a second display electrode and an insulating portion, wherein, the insulating portion comprises a plurality of first via holes; the first display electrode is disposed at a surface of the insulating portion, and the second display electrode is disposed at bottom surfaces of the via holes.

According to another embodiment of the invention, there is provided a method for manufacturing an array substrate, comprising: forming patterns that include a gate line, a gate electrode and a common electrode line through a first patterning process; forming patterns that include a gate insulating layer, an active layer, a data line, a source electrode, a drain electrode and a TFT channel through a second patterning process; through a third patterning process, forming a passivation layer, and forming a via hole located in the passivation layer or in both the passivation layer and the gate insulating layer in a region where a display electrode is to be formed, so as to form a bottom surface exposed by the via hole and a surface of the passivation layer retained outside the via hole; and forming a first display electrode and a second display electrode through a fourth patterning process.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

Figure 1:
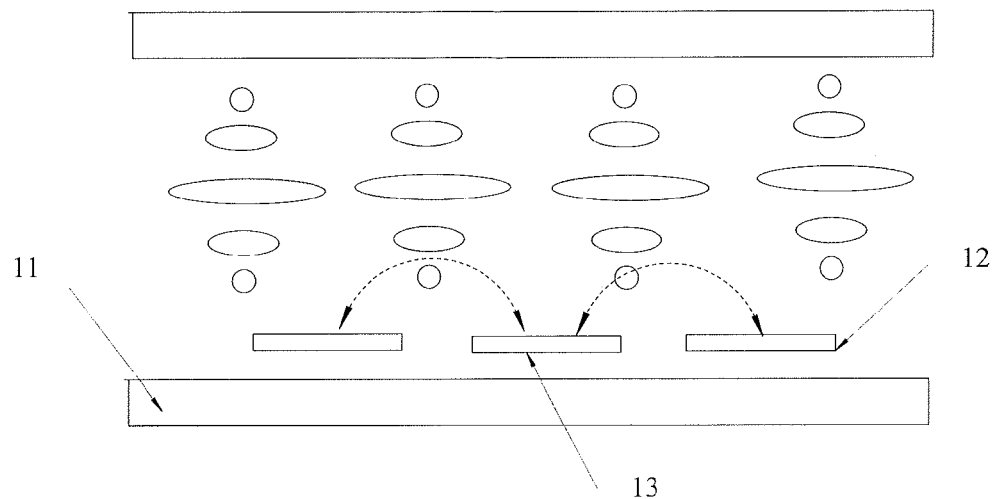
FIG. 1 is a structurally schematic view illustrating an array substrate of an IPS display mode in the related art.
Figure 2:
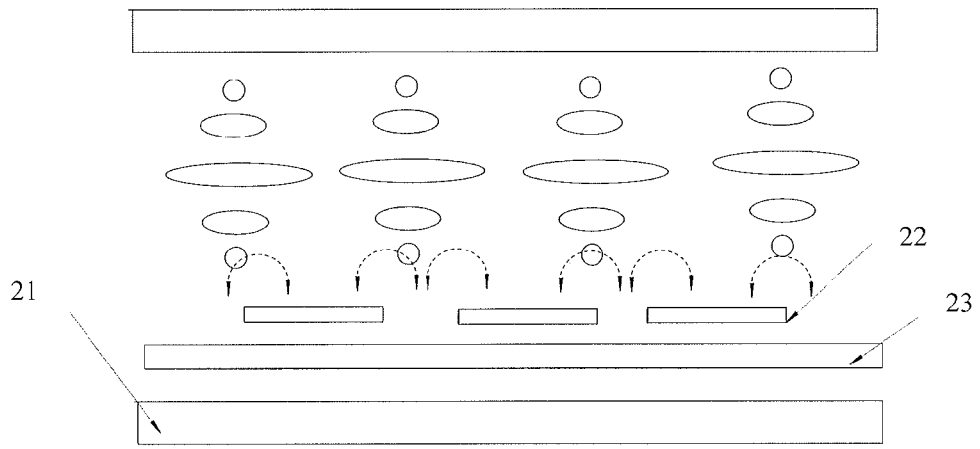
FIG. 2 is a structurally schematic view illustrating an array substrate of an ADS display mode in the related art.

In order to make objects, technical details and advantages of the embodiments of the invention apparent, hereinafter, the technical solutions in the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which belong(s) to the scope sought for protection by the invention.

It is to be noted that:

1. The patterning process mentioned in the present disclosure includes photoresist applying, masking, exposure, development, etching, photoresist stripping and other process steps, and a positive photoresist will be described as an example in embodiments of the invention;

2. "On" in such as "X is disposed on Y" or "on X is disposed Y" mentioned in the present disclosure generally encompasses such meanings: X contacting Y, and X being located over Y. As shown in drawings, a base substrate is disposed in the lowermost part in embodiments of the invention;

3. The invention does not set a concrete limit to pattern of a pixel electrode, and only the pattern of the pixel electrode shown in drawings will be described as an example in embodiments of the invention.

On an array substrate, an electric filed can be formed between a common electrode and a pixel electrode for driving liquid crystal molecular so as to performing display; therefore, they can be referred as display electrode. As for the pixel electrode and the common electrode in the embodiments of the invention, one of them can be referred as first display electrode, and the other can be referred as second display electrode.

An embodiment of the invention provides an array substrate comprising a plurality of pixel units, the pixel unit including a pixel electrode, a common electrode and an insulating portion, wherein, the insulating portion comprises a plurality of first via holes;

the common electrode is disposed at bottom surfaces of the first via holes, and the pixel electrode is disposed at a surface of the insulating portion, alternatively the common electrode is disposed at a surface of the insulating portion, and the pixel electrode is disposed at bottom surfaces of the first via holes.

For convenience of electrical connection between the electrode at the bottom surfaces of the first via holes and electrode layer or element therebelow, the first via holes can penetrate the insulating portion in its thickness direction.

In the array substrate structure provided by the embodiment of the invention, the first via holes are disposed within the insulating portion, and the inner walls of the first via holes are composed of the insulating portion and have an insulating effect, thereby allowing the pixel electrode and the common electrode that are disposed at the bottom surfaces of the first via holes and the surface of the insulating portion to be insulated from each other.

Arrangement of the pixel electrode and the common electrode includes the following two cases: the pixel electrode is located at the bottom surfaces of the first via holes, and the common electrode is located on the surface of the insulating portion; alternatively, the pixel electrode is located on the surface of the insulating portion, and the common electrode is located at the bottom surfaces of the first via holes. With the above two arrangement modes, not only the pixel electrode and the common electrode are disposed on different planes, so that an electric field for revolving liquid crystal molecules that has a better controllable area can be formed, but also there is no overlapping zone between the pixel electrode and the common electrode, so as to achieve an object of not producing the storage capacitance.

Considering that an object of a pixel electrode and a common electrode being arranged in a staggered way on different planes and being insulated from each other can be achieved by utilizing the structure of the first via holes per se, and in view of the feature that the pixel electrode and the common electrode each may be made of a transparent conductive metal, on the basis of depositing a transparent conductive layer on the region where the first via holes are located, the pixel electrode and the common electrode, which are located at bottom surfaces of the first via holes or the surface of the insulating portion, respectively, are formed through one patterning process.

With the use of the structural features of the array substrate provided by the embodiment of the invention, not only the pixel electrode and the common electrode are disposed on different planes, thereby forming an electric field for revolving liquid crystal molecules that has a better controllable area, but also there is no overlapping zone between the pixel electrode and the common electrode, thereby avoiding such an issue that a largestorage capacitance is formed because a large overlapping zone is present between the pixel electrode and the common electrode. Thus, problems in quality such as greenish, line image sticking, etc. resulting from the large storage capacitance can be avoided, and the yield of products is enhanced.

It is to be noted that, for the sake of avoiding problems in quality such as greenish, line image sticking, etc. resulting from a storage capacitance that is generated between the pixel electrode and the common electrode, according to the invention, such a configuration is provided in the array substrate structure that there is no overlapping zone between the pixel electrode and the common electrode so that there is no storage capacitance between the two. However, the storage capacitor is essential for normal operation of the array substrate, and therefore, such a configuration can be provided in the array substrate structure provided by the embodiment of the invention that there is an overlapping zone between the pixel electrode and a common electrode line so as to form a suitable storage capacitance.

For example, the pixel electrode is disposed at the surface of the insulating portion outside the first via holes, and the common electrode is disposed at bottom surfaces of the first via holes.

Specifically, when the pixel electrode is disposed at the surface of the insulating portion outside the first via holes, the region where provision of the pixel electrode is necessary, which includes an opening region of a pixel and a region of the passivation layer directly above a drain electrode (in this region, the pixel electrode will be connected to the drain electrode), should be determined in accordance with practical circumstances.

Specifically, the common electrode is disposed at bottom surfaces of the first via holes, so that the common electrode is directly connected to the common electrode line.

For example, the insulating portion comprises a gate insulating layer and/or a passivation layer.

Specifically, in a common structure of array substrate, regarding structures possessing an insulating property, there are a gate insulating layer and a passivation layer. The gate insulating layer is a film layer for insulating a gate line, a gate electrode and a common electrode line from an active layer, a data line, a source electrode and a drain electrode; and the passivation layer is a film layer for insulating a data line and the source electrode from a pixel electrode. By means of setting the first via holes on the passivation layer and/or the gate insulating layer having an insulating property, the pixel electrode and the common electrode can be insulated from each other, and an object of arranging the pixel electrode and the common electrode on different planes is achieved.

For example, inner walls of the first via holes make an acute-angle with their bottom surfaces.

Specifically, making an acute-angle between inner walls and bottom surfaces of first via holes can facilitate formation of the pixel electrode and the common electrode located inside/outside of the first via holes through one patterning process.

For example, the array substrate further comprises a planarization layer.

Specifically, to avoid the first via holes from adversely affecting the subsequent manufacturing process of the substrate, a planarization layer is coated on the pixel electrode and the common electrode according to the device, so as to make the whole surface of the array substrate planar.

It is to be noted that, the invention does not set a limit to other functional structures than the pixel electrode and the common electrode in the above array substrate, namely, the structural configuration of the array substrate provided by the invention may be diversified. Any structure of array substrate that meets characteristics of structural configuration of the pixel electrode and the common electrode of the invention may be possible, and also comes within the scope of protection of the invention.

Embodiment 1

Figure 3A:
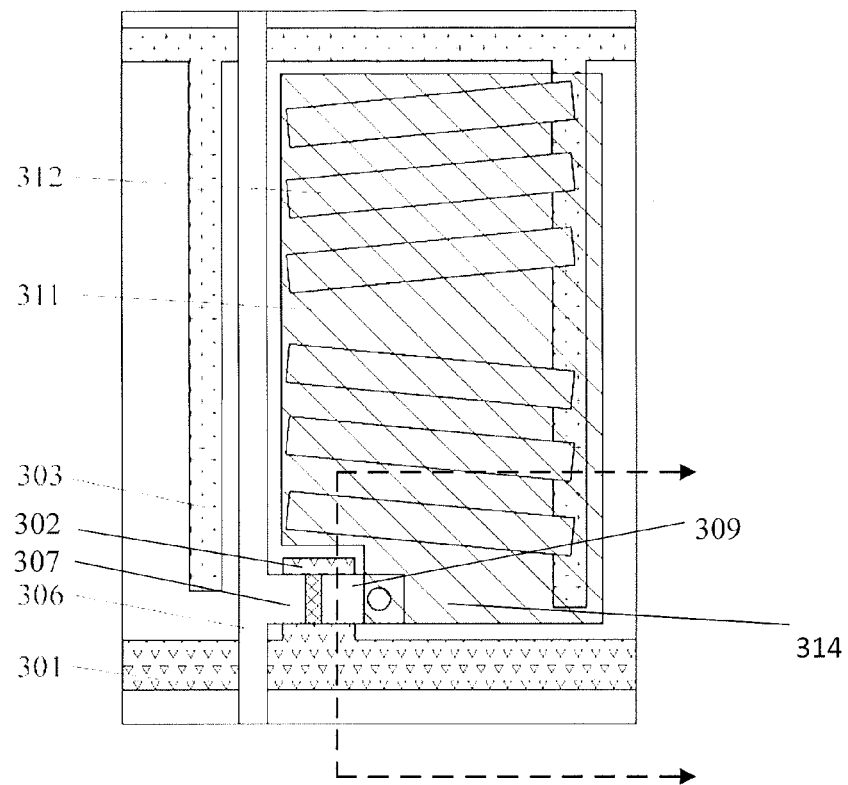
FIG. 3(a) is a schematic plan view illustrating an array substrate provided by Embodiment 1 of the invention.
Figure 3B:
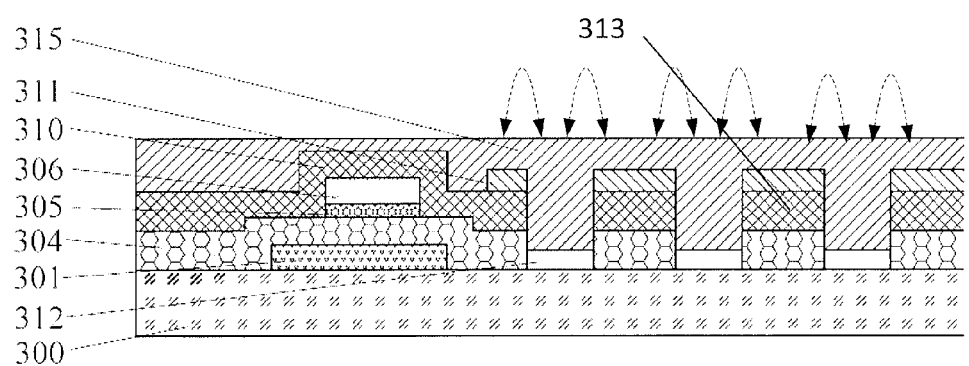
FIG. 3(b) is a schematically sectional view illustrating the array substrate provided by Embodiment 1 of the invention.

An embodiment of the invention provides an array substrate. As shown in FIG. 3(a) and FIG. 3(b), the array substrate comprises a plurality of pixel units, each of which includes a base substrate 300, a gate line 301, a gate electrode 302, a common electrode line 303, a gate insulating layer 304, an active layer 305, a data line 306, a source electrode 307, a drain electrode 309, a TFT channel (not shown in the figure), a passivation layer 310, a pixel electrode 311, a common electrode 312 and a planarization layer 315.

The gate line 301, the gate electrode 302, and the common electrode line 303 are disposed on the base substrate 300, and the gate line 301 is connected to the gate electrode 302.

The gate insulating layer 304 is disposed on the gate line 301, the gate electrode 302, and the common electrode line 303, acting to insulate the gate line 301, the gate electrode 302 and the common electrode line 303 from the active layer 305, the data line 306, the source electrode 307 and the drain electrode 309.

The active layer 305, the data line 306, the source electrode 307, the drain electrode 309 and the TFT channel are disposed on the gate insulating layer 304, and they constitute a TFT jointly. The data line 306 is connected to the source electrode 307.

The passivation layer 310 is disposed over the active layer 305, the data line 306, the source electrode 307, the drain electrode 309 and the TFT channel, acting to insulate the data line 306 and the source electrode 307 from the pixel electrode 311.

First via holes 313 are provided in a region where the passivation layer 310 and the gate insulating layer 304 overlap, and a second via hole 314 is provided in the passivation layer 310 over the drain electrode 309.

The pixel electrode 311 are disposed on the passivation layer 310 in set regions outside the first via holes 313, and are connected to the drain electrode 309 through the second via hole 314.

The common electrode 312 is disposed at bottom surfaces of the first via holes 313, and is connected to the common electrode line 303.

The planarization layer 315 is disposed on the pixel electrode 311 and the common electrode 312, and has a planar surface, so as to avoid the subsequent fabrication process from being adversely affected by steps owing to the first via holes 313.

The array substrate provided by the embodiment has the following structural features. The pixel electrode 311 are disposed on the surfaces of the passivation layer 310 outside the first via holes 313, and the common electrode 312 are disposed at bottom surfaces of the first via holes 313, namely, they are arranged on different planes. The first via holes 313 are provided in a region where the passivation layer 310 and the gate insulating layer 304 overlap, so inner walls of the first via holes 313 are constituted by the passivation layer 310 and the gate insulating layer 304. In the event that the pixel electrode 311 are arranged on the surface of the passivation layer in set regions outside the first via holes 313 and the common electrode 312 are disposed at bottom surfaces of the first via holes 313, the pixel electrode 311 and the common electrode 312 will be separated by inner walls of the first via holes 313 to be insulated from each other. Further, the pixel electrode 311 are connected to the drain electrode 309 so as to receive a data line signal; and the common electrode 312 are connected to the common electrode line 303 so as to receive a common electrode signal.

On the basis of the above structural features, in the array substrate provided by the embodiment, when the pixel electrode 311 receive the data line signal and the common electrode 312 receive the common electrode signal, liquid crystal driving electric fields as indicated by dotted arrows in the figure can be formed. Relative to an array substrate of an IPS display mode, the controllable area coverage of the electric fields is wider, and thus, it is better than the array substrate of the IPS display mode in terms of transmittance, luminance, contrast, etc. Furthermore, relative to an array substrate of an ADS display mode, there is no overlapping zone between the pixel electrode 311 of the array substrate and the common electrode 312, and accordingly, no storage capacitance will be formed between the two, whereby bad problems in quality such as greenish, line image sticking, etc. can be avoided from occurring. In summary, with the array substrate provided by the embodiment, not only better liquid crystal driving electric fields can be formed, but also various issues resulting from a larger storage capacitance between a pixel electrode and a common electrode can be avoided, thereby enhancing the yield of products.

Embodiment 2

Figure 3C:
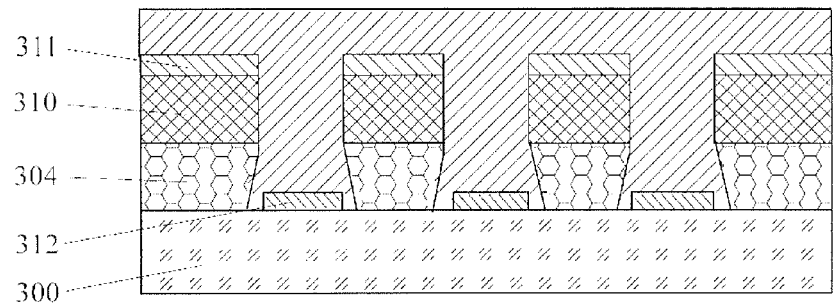
FIG. 3(c) is a schematically sectional view illustrating an array substrate provided by Embodiment 2 of the invention.

The present embodiment provides another array substrate, and as compared to Embodiment 1, it differs in that a chamfer process is performed upon forming the first via holes 313 so as to form a chamfer structure, i.e., an acute-angle is formed between the gate insulating layer 304 and the base substrate 300, as shown in FIG. 3(*c*). Such a via hole structure can facilitate formation of the pixel electrode 311 and the common electrode 312 inside/outside the first via holes 313 by one patterning.

Accordingly, the embodiment of the invention further provides a method for manufacturing the array substrate as stated above, comprising:

forming patterns that include the gate line, the gate electrode and the common electrode line through a first patterning process;

forming patterns that include the gate insulating layer, the active layer, the data line, the source electrode, the drain electrode and the TFT channel through a second patterning process;

forming the passivation layer and the first via holes located in the passivation layer and/or the gate insulating layer through a third patterning process;

forming the pixel electrode and the common electrode through a fourth patterning process.

In the method according to the embodiment of the invention, by means of providing the first via holes in the passivation layer and/or the gate insulating layer, and arranging the pixel electrode and the common electrode with the use of the first via holes, provision of the pixel electrode and the common electrode on different planes is realized, and an object of forming an electric field that acts to drive liquid crystal molecules to rotate and has a fine, controllable area is achieved. Further, an object of storage capacitance not being produced between the pixel electrode and the common electrode is also achieved, and such an issue that a larger storage capacitance is formed due to existence of a larger overlapping zone between a pixel electrode and a common electrode is avoided. Thereby, bad problems in quality such as greenish, line image sticking and so on that result from the larger storage capacitance can be avoided from occurring, and the yield of products is enhanced.

For example, forming of the first via holes located on the passivation layer and/or the gate insulating layer through the third patterning process comprises:

forming the first via holes, inner walls of which are perpendicular to their bottom surfaces, in the passivation layer and/or gate insulating layer.

Specifically, in order that an issue of storage capacitance being produced between a pixel electrode and a common electrode can be avoided favorably, the pixel electrode and the common electrode can be made to have no overlapping zone therebetween by means of forming the first via holes whose inner walls are perpendicular to their bottom surfaces. Thus, storage capacitance is avoided from being produced.

For example, forming of the pixel electrode and the common electrode through the fourth patterning process comprises:

forming a transparent conductive thin film, applying photoresist on the transparent conductive thin film, and performing an exposure and development treatment through a normal mask, so that the photoresist is retained inside the first via holes and on a surface of the passivation layer in set regions outside the first via holes, and does not exist in other region;

etching off the transparent conductive thin film that is exposed by the other region, so as to form a transparent conductive pattern at the bottom surfaces, inner walls of the first via holes, and on the surface of the passivation layer in the set regions outside the first via holes;

stripping the remaining photoresist;

etching off the transparent conductive pattern on the inner walls of the first via holes, so as to form the pixel electrode located on the surface of the passivation layer in the set regions outside the first via holes and the common electrode located at the bottom surfaces of the first via holes.

Specifically, forming the pixel electrode and the common electrode with the use of the first via holes includes the following two cases:

the pixel electrode are disposed at the bottom surfaces of the first via holes, and the common electrode are disposed on the surface of the passivation layer in set regions outside the first via holes; alternatively, the pixel electrode are disposed on the surface of the passivation layer in set regions outside the first via holes, and the common electrode are disposed at the bottom surfaces of the first via holes.

Specifically, considering that an object of the pixel electrode and the common electrode being arranged in a staggered way on different planes and being insulated from each other can be achieved by utilizing the structure of the first via holes per se, and in view of the feature that the pixel electrode and the common electrode each may be made of a transparent conductive layer, according to the embodiment of the invention, it is possible that a transparent conductive layer is deposited on the region where the first via holes are located and then the pixel electrode and the common electrode, which are located inside and outside the first via holes, respectively, are formed through one patterning process. Regarding the method according to the embodiment of the invention, the pixel electrode and the common electrode that are arranged in a staggered way on different planes are formed through one patterning process, and as compared with an existing array substrate of an ADS display mode, not only a series of bad problems resulting from the fact that a larger storage capacitance is formed between a pixel electrode and a common electrode can be avoided, but also the patterning number can be decreased and the fabrication process of the substrate can be simplified by means of forming the pixel electrode and the common electrode through the same patterning process. Thus, the cost is reduced.

Specifically, a concrete procedure of forming the pixel electrode and the common electrode simultaneously with one patterning process is:

firstly, a layer of a transparent conductive thin film for forming the pixel electrode and the common electrode is coated, and then, the transparent conductive thin film on regions except the inside of the first via holes and set regions outside the first via holes (i.e. regions where the pixel electrode and the common electrode are to be formed) is etched off through an exposure, development and etch treatment. The main purpose of this process is to etch off the transparent conductive thin film on regions where the pixel electrode and the common electrode are not required to be formed. The set regions outside the first via holes refer to regions except the areas where the first via holes are located and areas outside the first via holes where the pixel electrode and the common electrode are not required to be formed within the whole pixel unit. Upon specific implementation of this step, if the transparent conductive film for forming the pixel electrode and the common electrode is also used for formation of other transparent conductive pattern (e.g. a pattern having a conductive connection function), then upon etching of the transparent conductive thin film through the exposure, development and etch treatment, it is also necessary to consider forming this transparent conductive pattern, that is, retaining the transparent conductive thin film on a domain for forming this transparent conductive pattern.

After that, the remaining photoresist is stripped, so as to form the transparent conductive pattern at bottom surfaces, inner walls of the first via holes and on the surface of the passivation layer in set regions outside the first via holes.

Finally, the transparent conductive pattern on the inner walls of the first via holes is etched off, so as to form a pixel electrode pattern on the surface of the passivation layer in the set regions outside the first via holes, and a common electrode pattern on the bottom surfaces of the first via holes. This process can be completed by using dry etching. Specifically, as the transparent conductive thin film deposited outside the first via holes and at the bottom surfaces of the first via holes is thicker than the transparent conductive thin film deposited on the inner walls of the first via holes, a dry etching process can be used to etch off the transparent conductive pattern at the bottom surfaces and the inner walls of the first via holes and in the set regions outside the first via holes by a certain thickness, which is exactly equal to the thickness of the transparent conductive thin film on inner walls of the first via holes. The finally obtained result is that the transparent conductive pattern is not present on inner walls of the first via holes any more, while the pixel electrode are formed on the surface of the passivation layer in the set regions outside the first via holes, and the common electrode are formed at bottom surfaces of the first via holes.

For example, forming of the first via holes that are located in the passivation layer and/or the gate insulating layer through the third patterning process comprises:

on the passivation layer and/or the gate insulating layer, forming the first via holes, inner walls of which make an acute-angle with their bottom surfaces.

Specifically, to allow an acute-angle to be made between an inner wall of a first via hole and its bottom surface, it can be achieved by the following two ways. One way is to let the density of a gate insulating thin film deposited for formation of the gate insulating layer be smaller than that of a passivation layer thin film deposited for formation of the passivation layer (namely, the gate insulating thin film is relatively porous, and the passivation layer thin film is relatively dense), and then foam the first via hole by etch. During etch of the first via hole, as the etch rate of the gate insulating thin film will be larger than the etch rate of the passivation layer thin film, this will allow a portion of the first via hole sunk into the gate insulating thin film to be wider than its portion sunk into the passivation layer thin film, that is, allow an acute-angle to be made between the inner wall of the first via and its bottom surface. The other way is to deposit a gate insulating thin film for formation of the gate insulating layer by two times (namely, deposit a gate insulating thin film that is relatively porous firstly, and then deposit a gate insulating thin film that is relatively dense), and then form the first via hole by etch. During etch of the first via hole, as the etch rate of the gate insulating thin film deposited earlier will be larger than the etch rate of the gate insulating layer thin film deposited later, this will allow a portion of the first via hole sunk into the gate insulating thin film deposited earlier to be wider than its portion sunk into the gate insulating thin film deposited later, that is, allow an acute-angle to be made between the inner wall of the first via and its bottom surface.

With the method according to the embodiment of the invention, by means of configuring the first via holes to have an acute-angle between its inner wall and bottom surface, the pixel electrode on the surface of the passivation layer in set regions outside the first via holes and the common electrode at bottom surfaces of the first via holes can be formed directly with the use of the acute-angled structure of the first via holes upon deposition of the transparent conductive thin film. Because the transparent conductive thin film will not be deposited on inner walls of the first via holes with the help of the acute-angled structure of the first via holes and can be detached naturally at the acute-angled structure according to this method, a process for etching off the transparent conductive pattern on inner walls of the first via holes is not needed, either. Further, the fabrication process of the substrate is simplified, and the cost is saved.

For example, the forming of the pixel electrode and the common electrode through the fourth patterning process comprises:

forming a transparent conductive thin film, applying photoresist on the transparent conductive thin film, and performing an exposure and development treatment through a normal mask, so that the photoresist is retained inside the first via holes and on a surface of the passivation layer in set regions outside the first via holes, and does not exist in other region;

etching off the transparent conductive thin film that is exposed by the other region, so as to form a transparent conductive pattern at the bottom surfaces of the first via holes and on the surface of the passivation layer in the set regions outside the first via holes; and stripping the remaining photoresist, so as to form the pixel electrode that are located on the surface of the passivation layer in the set regions outside the first via holes, and the common electrode that are located at the bottom surfaces of the first via holes.

The third pattern process can further form the second via hole in the passivation layer located over the drain electrode, and the second via hole is used for connection between the pixel electrode and the drain electrode. The first via holes and the second via hole are formed in one patterning process, and they are formed with different depth, which can be realized by controlling the etching material and the etching rate.

For example, the method according to the embodiment of the invention further comprises: forming a planarization layer that is located on the pixel electrode and the common electrode.

Specifically, in the method of the embodiment of the invention, the planarization layer is coated on the pixel electrode and the common electrode to make the whole surface of the array substrate planar, so as to avoid the first via holes from adversely affecting the subsequent fabrication process of the substrate.

It is to be noted that, in the method for manufacturing the array substrate provided by the embodiment of the invention, merely the mode to fabricate the pixel electrode and the common electrode is described, and the mode to fabricate other functional elements in the array substrate is not limited. Those skilled in the art can select proper processes to fabricate other functional elements in accordance with the array substrate structure to be formed actually.

Embodiment 3

The present embodiment provides an array substrate manufacturing method, for manufacturing the array substrate provided by Embodiment 1.

To facilitate description of a patterning process, the whole area of the base substrate is divided into the following parts in the embodiment: a gate line area, a gate electrode area, a common electrode line area, an active layer area, an data line area, a source electrode area, a drain electrode area, a TFT channel area, a pixel electrode area, a common electrode area, a first via hole area and a second via hole area. A certain area is the mapping region (projection region) of a certain pattern on the base substrate, which has the same shape as the corresponding pattern. That is, it is a region on the base substrate where a certain pattern is to be fabricated. For example, the gate line area is the mapping region of pattern of the gate line on the base substrate.

The manufacturing method comprises the following steps.

Figure 4A:
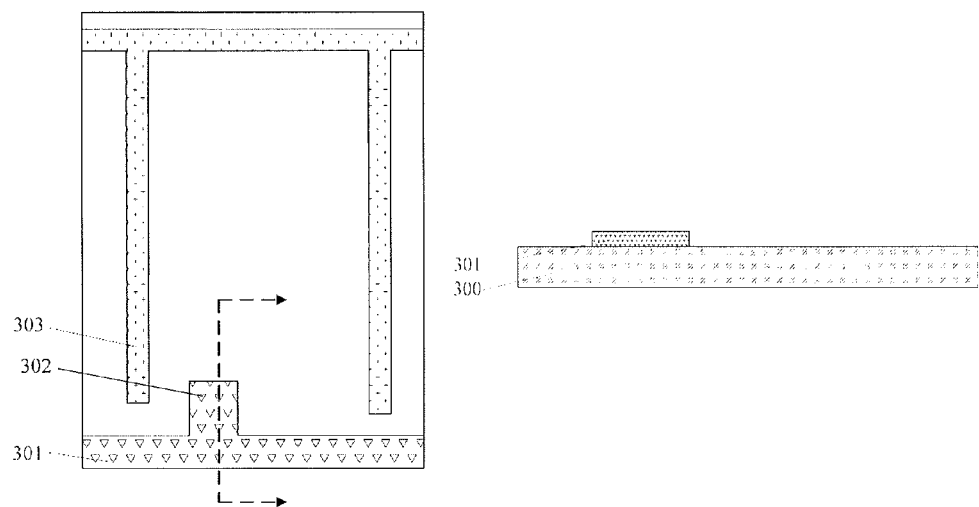
FIG. 4(a) is a schematic plan view and a schematically sectional view illustrating a substrate after it is subjected to a first patterning process in Embodiment 3 of the invention.

Step 41, as shown in FIG. 4(a), a gate metal thin film is formed on a base substrate 300, and patterns comprising the gate line 301, the gate electrode 302 and the common electrode line 303 are formed by a first patterning process.

Specifically, as shown in FIG. 4(a), firstly by using plasma enhanced chemical vapor deposition (PECVD), magnetron sputtering, thermal evaporation, or other film forming method, the gate metal thin film is formed on the base substrate 300 (e.g. a glass substrate or a quartz substrate). The gate metal thin film may be a single-layered thin film formed from molybdenum, aluminum, an alloy of aluminum and neodymium, tungsten, chromium, copper or other metal, and may also be a multiple-layered thin film formed from the above metals.

Then, photoresist is coated on the gate metal thin film, and after it is subjected to a development treatment in an exposure machine with a common mask, the photoresist is retained in the gate line area, the gate electrode area and the common electrode line area, and is not present in other region. The gate metal thin film exposed by the other region is etched off through an etching process; and the remaining photoresist is stripped, so as to form the figure comprising the gate line 301, the gate electrode 302 and the common electrode line 303.

Figure 4B:
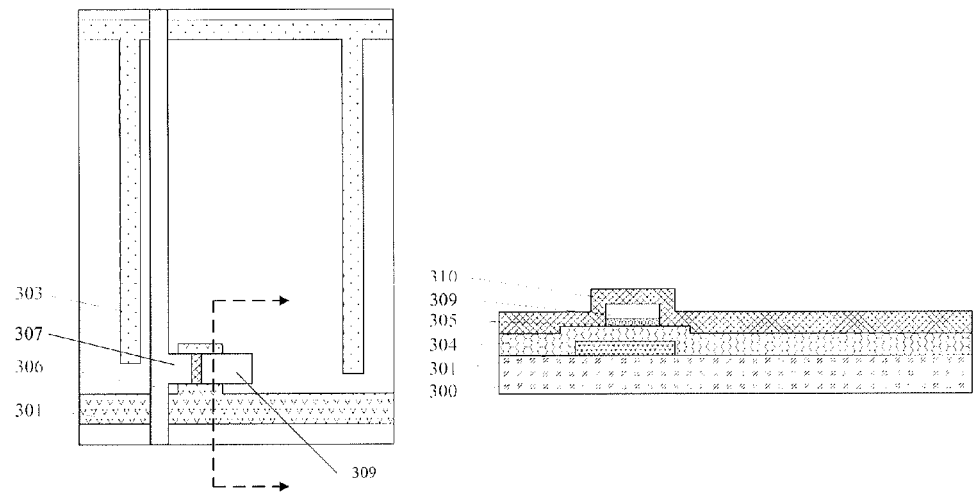
FIG. 4(b) is a schematic plan view and a schematically sectional view illustrating the substrate after it is subjected to a second patterning process in Embodiment 3 of the invention.

Step 42, as shown in FIG. 4(b), a gate insulating thin film, an active layer thin film and a source and drain metal thin film are formed, and patterns comprising the gate insulating layer 304, the active layer 305, the data line 306, the source electrode 307, the drain electrode 309 and the TFT channel (not shown in the figure) are formed through a second patterning process.

Specifically, as shown in FIG. 4(b), firstly by using plasma enhanced chemical vapor deposition (PECVD), magnetron sputtering, thermal evaporation or other film forming method, the gate insulating thin film, the active layer thin film and the source and drain metal thin film are formed in sequence. A single-layered thin film of SiNx, SiOx or SiOxNy or a multilayered thin film formed through multilayer deposition of the above materials may be used as the gate insulating thin film. The active layer thin film includes a semiconductor thin film and a doped semiconductor thin film. The source and drain metal thin film may be a single-layered thin film formed from molybdenum, aluminum, an alloy of aluminum and neodymium, tungsten, chromium, copper or other metal, and may also be a multilayered thin film formed through multilayer deposition of the above metals.

Afterwards, photoresist is coated on the source and drain metal thin film, and is subjected to an exposure and development treatment through a double-tone mask, so that the photoresist in the source electrode area, the drain electrode area and the data line area has a first thickness, the photoresist in the TFT channel area has a second thickness, and no photoresist covers other region. The first thickness is larger than the second thickness. The source and drain metal thin film and the active layer thin film exposed by the other region are etched in sequence; and then a photoresist ashing process is carried out to remove the photoresist in the source electrode area, the drain electrode area, the data line area and the TFT channel area by the second thickness, so that the TFT channel area is exposed. The source and drain metal thin film and the active layer thin film exposed by the TFT channel area are etched in sequence, so as to form patterns comprising the TFT channel and the active layer 305; and the remaining photoresist is stripped, so as to form patterns comprising the data line 306, the source electrode 307 and the drain electrode 309.

Figure 4C:
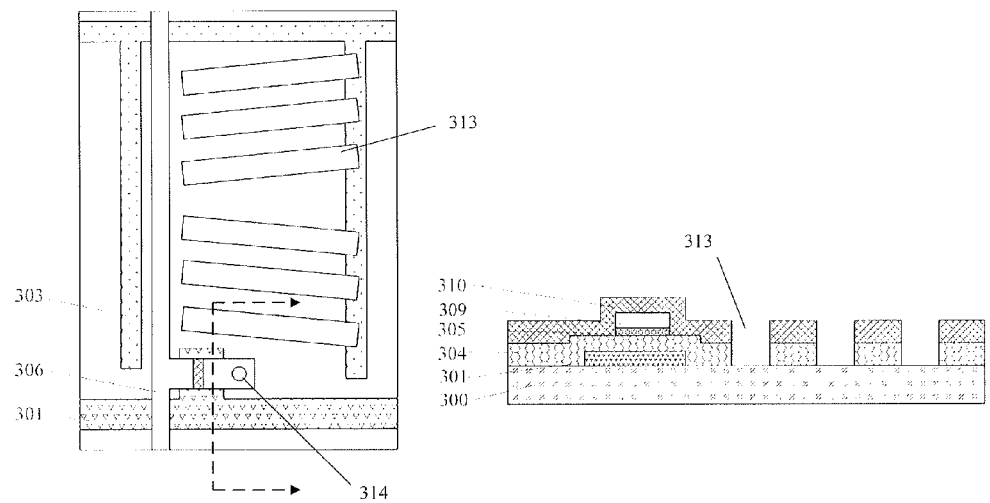
FIG. 4(c) is a schematic plan view and a schematically sectional view illustrating the substrate after it is subjected to a third patterning process in Embodiment 3 of the invention.

Step 43, as shown in FIG. 4(b) and FIG. 4(c), a passivation layer thin film is formed, and the passivation layer 310, the first via holes 313 and the second via hole 314 are formed through a third patterning process.

Specifically, as shown in FIG. 4(c), firstly, plasma enhanced chemical vapor deposition (PECVD), magnetron sputtering, thermal evaporation or other film forming method is employed to form the passivation layer thin film. A single-layered thin film of SiNx, SiOx or SiOxNy or a multilayered thin film formed through multilayer deposition of the above materials may be used as the passivation layer thin film.

Afterwards, photoresist is coated on the passivation layer thin film, and is subjected to an exposure and development treatment through a double-tone mask, so that no photoresist covers the first via hole area, the photoresist in the second via hole area has a third thickness, and the photoresist in other area than the first via hole area and the second via hole area has a fourth thickness. The third thickness is smaller than the fourth thickness. The passivation layer thin film and the gate insulating thin film exposed by the first via hole area are etched in sequence, so as to foam the first via holes 313. It should be ensured that the common electrode line 303 is exposed by bottom surfaces of the first via holes 313, allowing the common electrode 314 to be formed at the bottoms of the first via holes 313 subsequently to be connected to the common electrode line 303. The photoresist in the second via hole area and the other area is removed through a photoresist ashing process by the third thickness, so that there is no photoresist in the second via hole area. The passivation layer thin film exposed by the second via hole area is etched to form the second via hole 314, so that the drain electrode 309 is exposed and thereby the pixel electrode 311 formed subsequently is allowed to be connected to the drain electrode 309. The remaining photoresist is stripped, so as to form the passivation layer 310.

Upon specific implementation of this step, after the photoresist is coated on the passivation layer thin film, it may also be possible that the photoresist is subjected to an exposure and development treatment with a normal mask, so that neither the first via hole area nor the first via hole area is covered by the photoresist, and then the first via hole area and the second via hole area are etched simultaneously in one etch process. In this etch process, it is possible that the first via hole area and the second via hole area can be controlled to have different etch rates, to thereby form the first via holes and the second via hole finally. In this way, the first via holes and the second via hole having different depths are formed simultaneously by one etch, simplifying the manufacturing process.

Figure 4D:
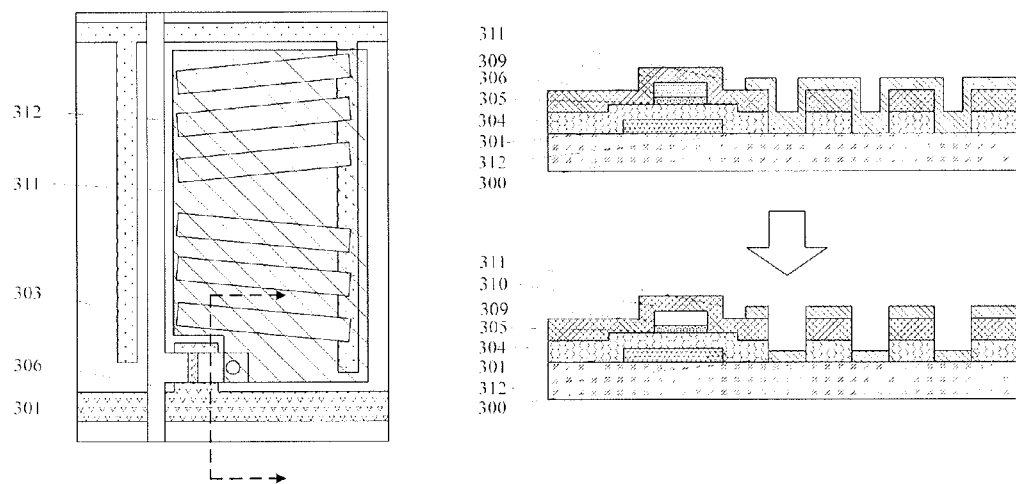
FIG. 4(d) is a schematic plan and a schematically sectional view illustrating the substrate after it is subjected to a fourth patterning process in Embodiment 3 of the invention.
Figure 4E:
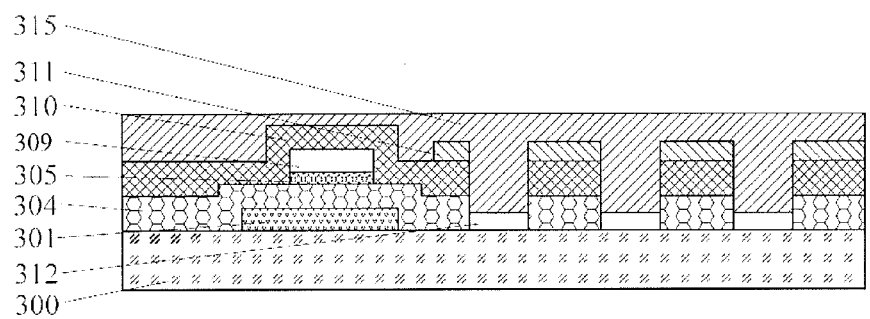
FIG. 4(e) is a schematically sectional view after a planarization layer 315 is formed in Embodiment 3 of the invention.

Step 44, as shown in FIG. 4(d), a transparent conductive thin film is formed, and through a fourth patterning process, the pixel electrode 311 on the passivation layer 310 in set regions outside the first via holes 313 and the common electrode 314 at bottoms of the first via holes 313 are formed.

Specifically, as shown in FIG. 4(d), the transparent conductive thin film is firstly formed by using a general film forming method; and the transparent conductive thin film may adopt ITO, IZO or other material.

Afterwards, photoresist is coated on the transparent conductive thin film, and is subjected to an exposure and development treatment through a normal mask, so that the photoresist is retained in the pixel electrode area and the common electrode area and no photoresist exists in other region than the pixel electrode area and the common electrode area. The transparent conductive thin film exposed by the other region than the pixel electrode area and the common electrode area is etched off; and the remaining photoresist is stripped, so that the transparent conductive thin film merely exists on the pixel electrode area, inner walls of the first via holes 313 and the common electrode area.

At last, the transparent conductive thin film on inner walls of the first via holes 313 is etched off by using a dry etching process, so that the pixel electrode 311 on the passivation layer 310 surrounding the first via holes 313 and the common electrode 314 located inside the first via holes 313 are formed.

Step 45, as shown in FIG. 4(*e*), a planarization layer thin film is formed, and the planarization layer 315 is formed.

Specifically, the planarization layer thin film is formed by using plasma enhanced chemical vapor deposition (PECVD), magnetron sputtering, thermal evaporation or other film forming method; and it may adopt an organic polymer material.

The method for manufacturing the array substrate provided by the embodiment is merely one implementation mode, and in practical applications, those skilled in the art can form similar structures by changing the process approach. For example, when the transparent conductive pattern on inner walls of the first via holes is etched, dry etching can be used, and other etch mode such as wet etching can also be used besides, as long as an object of etching the transparent conductive pattern on inner walls of the first via holes can be accomplished.

The method for manufacturing the array substrate provided by the embodiment has the following merits: there is no overlapping zone between the pixel electrode and the common electrode in the produced array substrate, so that no storage capacitance will be formed, and a better electric field for driving liquid crystals can be generated upon reception of a data signal and a common electrode single; in terms of the manufacturing process, manufacture of the pixel electrode and the common electrode can be completed by using one patterning process, and the whole array substrate can be finished with only four patterning processes, thereby simplifying the fabrication process of the substrate, improving the production efficiency, and saving the production cost.

Embodiment 4

The present embodiment provides another array substrate manufacturing method, for manufacturing the array substrate provided by Embodiment 2. The method comprises the following steps:

Step S1, a gate metal thin film is deposited on the base substrate 300, and patterns comprising the gate line 301, the gate electrode 302 and the common electrode line 303 are formed through a first patterning process.

As for the concrete procedure, reference to the specific descriptions in Embodiment 3 can be made, and details are omitted here.

Step S2, a gate insulating thin film, an active layer thin film and a source and drain metal thin film are deposited, and through a second patterning process, patterns comprising the gate insulating layer 304, the active layer 305, the data line 306, the source electrode 307, the drain electrode 309 and the TFT channel (not shown in the figure) are formed.

As for the concrete procedure, reference to the specific descriptions in Embodiment 3 can be made, and details are omitted here.

Step S3, a passivation layer thin film is deposited, and through a third patterning process, the passivation layer 310, the first via holes 313 and the second via hole 314 are formed.

Specifically, firstly by using plasma enhanced chemical vapor deposition (PECVD), magnetron sputtering, thermal evaporation or other film forming method, the passivation layer thin film is deposited. A single-layered thin film of SiNx, SiOx or SiOxNy or a multilayered thin film formed through multilayer deposition of the above materials may be used as the passivation layer thin film.

Figure 5A:
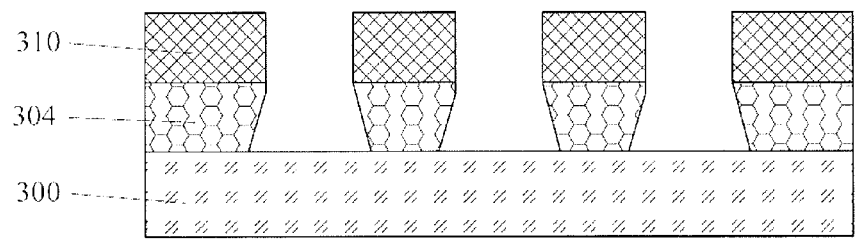
FIG. 5(a) is a schematically sectional view after first via holes 313 with chamfer are formed in Embodiment 4 of the invention.
Figure 5B:
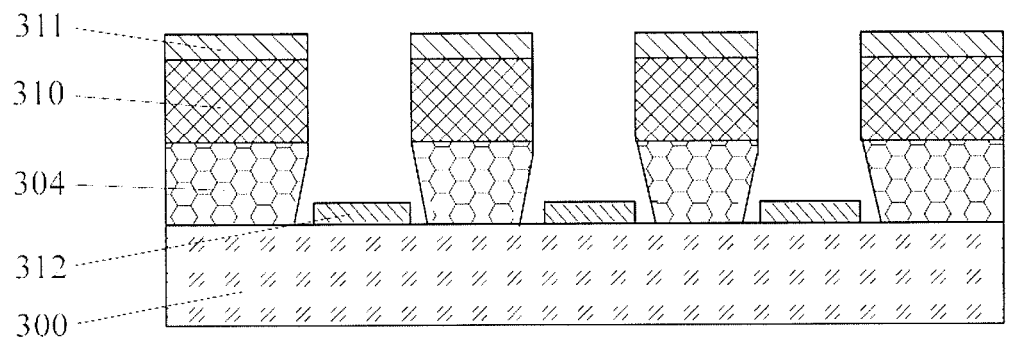
FIG. 5(b) is a schematically sectional view after a pixel electrode 311 and common electrode 312 are formed in Embodiment 4 of the invention.
Figure 5C:
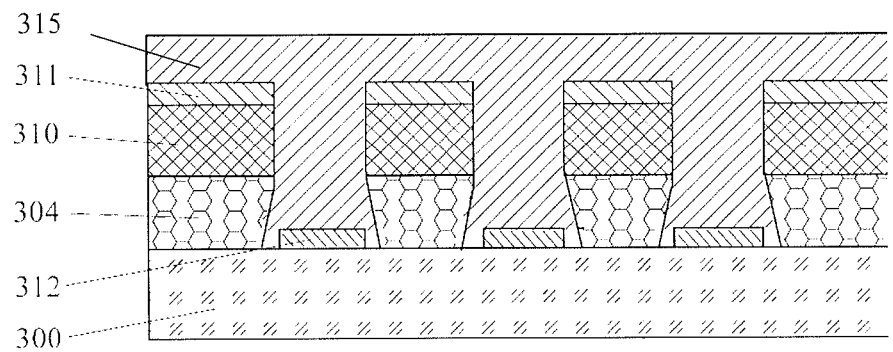
FIG. 5(c) is a schematically sectional view illustrating the structure of an array substrate formed in Embodiment 4 of the invention.

Afterwards, as shown in FIG. 5(*a*), photoresist is coated on the passivation layer thin film, and is subjected to an exposure and development treatment through a double-tone mask, so that no photoresist covers the first via hole area, the photoresist in the second via hole area has a third thickness, and the photoresist in other area than the first via hole area and the second via hole area has a fourth thickness. The third thickness is smaller than the fourth thickness. The passivation layer thin film and the gate insulating thin film exposed by the first via hole area are etched in sequence, and meanwhile a via-hole chamfering process is employed to form the first via holes 313 which have an acute angle between their inner wall and bottom surface (for example, between the gate insulating layer 304 and the base substrate 300). It should be ensured that the common electrode line 303 is exposed by bottom surfaces of the first via holes 313, so as to allow the common electrode 314 that will be formed at the bottom surfaces of the first via holes 313 subsequently to be connected to the common electrode line 303. The photoresist in the second via hole area and the other area is removed through a photoresist ashing process by the third thickness, so that there is no photoresist in the second via hole area. The passivation layer thin film exposed by the second via hole area is etched to form the second via hole 314, so that the drain electrode 309 is exposed and then the pixel electrode 311 formed subsequently can be connected to the drain electrode 309. The remaining photoresist is stripped, so as to form the passivation layer 310.

Step S4, a transparent conductive thin film is formed, and through a fourth patterning process, the pixel electrode 311 on the passivation layer 310 surrounding the first via holes 313 and the common electrode 314 at bottoms of the first via holes 313 are formed.

Specifically, the transparent conductive thin film is firstly deposited by using a general film forming method; and the transparent conductive thin film may adopt ITO, IZO or other material. In this course, under the impact of the first via holes 313 having the chamfer structure, the transparent conductive thin film will not be attached to inner walls of the first via holes 313, and therefore, the transparent conductive thin film attached to the passivation layer outside the first via holes 313 will be disconnected from the transparent conductive thin film attached to bottom surfaces of the first via holes 313 and be insulated from it.

Afterwards, photoresist is coated on the transparent conductive thin film, and is subjected to an exposure and development treatment through a normal mask, so that the photoresist is retained in the pixel electrode area and the common electrode area and no photoresist exists in other region than the pixel electrode area and the common electrode area. The transparent conductive thin film exposed by the other region than the pixel electrode area and the common electrode area is etched off; and the remaining photoresist is stripped, so that the transparent conductive thin film is merely present on the pixel electrode area and the common electrode area, as shown in FIG. 5(*b*). Up to here, the pixel electrode 311 and the common electrode 312 are formed.

Step S5, as shown in FIG. 5(*c*), a planarization thin film is deposited, and the planarization layer 315 is formed.

As for the concrete procedure, reference to the specific descriptions in Embodiment 3 can be made, and details are omitted here.

When the embodiment is compared to Embodiment 3, they have the same process steps of fabricating the gate line 301, the gate electrode 302, the common electrode line 303, the active layer 305, the data line 306, the source electrode 307, the drain electrode 309 and the TFT channel (not shown in the figure), the passivation layer 310, the second via hole 314 and the planarization layer 315. Difference lies in that, the chamfering process is employed upon formation of the first via holes 313 in the embodiment, so that the first via holes 313 possess a structural feature of having a chamfer. With the help of this structural feature, the transparent conductive thin film will not be deposited on inner walls of the first via holes 313, and thus the transparent conductive thin film in the pixel electrode area can be detached from the transparent conductive thin film in the common electrode area naturally, thereby saving a separate etching process that is required in Embodiment 1 for etching off the transparent conductive thin film on inner walls of the first via holes 313. Therefore, the embodiment has the merits of Embodiment 3, and further, it simplifies the manufacturing process and saves the cost.

Further, regarding the shape of the first via holes, their projection on the array substrate plane can be in the shape of a strip extending along a direction. The first via holes may comprise at least one group of strip-shaped via holes, the extending directions of which are parallel to each other. In the embodiment shown in FIG. 3(a), the first via holes comprise two groups of strip-shaped via holes, and the extending directions of via holes in each group of the strip-shaped via holes are parallel to each other.

Descriptions made above are merely exemplary embodiments of the invention, but are not used to limit the protection scope of the invention. The protection scope of the invention is determined by attached claims.

What is claimed is:

1. An array substrate, comprising a plurality of pixel units, each of the pixel units including a first display electrode, a second display electrode and an insulating portion, wherein,
   the insulating portion comprises a plurality of first via holes;
   the first display electrode is disposed at a surface of the insulating portion, and the second display electrode is disposed at bottom surfaces of the first via holes;
   an inner wall of each of the first via holes is perpendicular to its bottom surface.

2. The array substrate according to claim 1, wherein one of the first display electrode and the second display electrode is a pixel electrode, and the other one of the first display electrode and the second display electrode is a common electrode.

3. The array substrate according to claim 1, wherein the insulating portion comprises a passivation layer.

4. The array substrate according to claim 1, wherein the insulating portion comprises a gate insulating layer and a passivation layer that are laminated.

5. The array substrate according to claim 1, wherein the array substrate further comprises a planarization layer that is located over the first display electrode and the second display electrode.

6. The array substrate according to claim 1, wherein a projection of each first via hole on the plane of the array substrate is in a strip shape.

7. The array substrate according to claim 1, wherein the first via holes at least comprise a group of strip-shaped via holes having extending directions parallel to each other.

8. The array substrate according to claim 1, wherein the first via holes penetrate through the insulating portion in a thickness direction of the insulating portion.

9. A method for manufacturing an array substrate, comprising:
   forming patterns that include a gate line, a gate electrode and a common electrode line through a first patterning process;
   forming patterns that include a gate insulating layer, an active layer, a data line, a source electrode, a drain electrode and a TFT channel through a second patterning process;
   forming a passivation layer, and forming first via holes located in the passivation layer or in both the passivation layer and the gate insulating layer in a region where a first display electrode and a second display electrode are to be formed through a third patterning process; and
   forming the first display electrode and the second display electrode through a fourth patterning process,
   wherein forming the first via holes located in the passivation layer or in both the passivation layer and the gate insulating layer through the third patterning process comprises:
   forming the first via holes, an inner wall of each of which is perpendicular to its bottom surface, in the passivation layer or in both the passivation layer and the gate insulating layer,
   wherein forming the first display electrode and the second display electrode through the fourth patterning process comprises:
   forming a transparent conductive thin film, applying photoresist on the transparent conductive thin film, and performing an exposure and development treatment through a normal mask, so that the photoresist is retained at a surface of the passivation layer in the region where the first display electrode and the second display electrode are to be formed and does not exist in other region;
   etching off the transparent conductive thin film exposed by the other region;
   stripping the remaining photoresist;
   etching off the transparent conductive thin film on the inner walls of the first via holes, so as to form the first display electrode located at the surface of the passivation layer outside the first via holes and the second display electrode located at the bottom surfaces of the first via holes.

10. The method according to claim 9, wherein the first display electrode is a pixel electrode, and the second display electrode is a common electrode.

11. The method according to claim 10, wherein a second via hole is further formed in the passivation layer over the drain electrode by the third patterning process, and the second via hole is used for connection between the pixel electrode and the drain electrode.

12. The method according to claim 9, further comprising: forming a planarization layer located on the first display electrode and the second display electrode.

* * * * *